(12) United States Patent
Kawai

(10) Patent No.: US 9,444,219 B2
(45) Date of Patent: Sep. 13, 2016

(54) REPEATER, EXCITATION LIGHT SUPPLY DEVICE USED FOR THE SAME, AND EXCITATION LIGHT SUPPLY METHOD

(71) Applicant: NEC CORPORATION, Tokyo (JP)

(72) Inventor: Motoyoshi Kawai, Tokyo (JP)

(73) Assignee: NEC CORPORATION, Tokyo (JP)

( * ) Notice: Subject to any disclaimer, the term of this patent is extended or adjusted under 35 U.S.C. 154(b) by 109 days.

(21) Appl. No.: 14/376,464

(22) PCT Filed: Feb. 7, 2013

(86) PCT No.: PCT/JP2013/000660
§ 371 (c)(1),
(2) Date: Aug. 4, 2014

(87) PCT Pub. No.: WO2013/121744
PCT Pub. Date: Aug. 22, 2013

(65) Prior Publication Data
US 2015/0048238 A1    Feb. 19, 2015

(30) Foreign Application Priority Data

Feb. 14, 2012 (JP) ................................. 2012-029601

(51) Int. Cl.
| H01J 40/14 | (2006.01) |
|---|---|
| H01S 5/0683 | (2006.01) |
| H01S 3/067 | (2006.01) |
| H01S 3/094 | (2006.01) |
| H04B 10/291 | (2013.01) |
| H04B 13/02 | (2006.01) |
| H01S 3/0941 | (2006.01) |
| H01S 3/23 | (2006.01) |

(52) U.S. Cl.
CPC ......... *H01S 5/0683* (2013.01); *H01S 3/06754* (2013.01); *H01S 3/09408* (2013.01); *H04B 10/291* (2013.01); *H01S 3/09415* (2013.01); *H01S 3/094061* (2013.01); *H01S 3/094096* (2013.01); *H01S 3/2383* (2013.01); *H04B 13/02* (2013.01)

(58) Field of Classification Search
CPC ........... H01S 3/0912; H01S 3/094049; H01S 3/09461; H04B 10/291
USPC ...... 250/214 R, 214 A, 205, 551; 359/341.3, 359/341.32; 398/81
See application file for complete search history.

(56) References Cited

U.S. PATENT DOCUMENTS

| 5,274,496 | A | * | 12/1993 | Fujiwara | H01S 3/1301 |
|---|---|---|---|---|---|
| | | | | | 370/491 |
| 5,459,328 | A | | 10/1995 | Kadota et al. | |
| 5,539,570 | A | | 7/1996 | Ushirozawa | |
| 6,018,602 | A | | 1/2000 | Mayor et al. | |
| 9,083,142 | B2 | * | 7/2015 | Sakauchi | H04B 10/291 |
| 2010/0129081 | A1 | | 5/2010 | Onaka | |

FOREIGN PATENT DOCUMENTS

| CN | 1832385 A | 9/2006 |
|---|---|---|
| EP | 0878880 A1 | 11/1998 |
| JP | 4-3029 A | 1/1992 |
| JP | 5-268166 A | 10/1993 |
| JP | 11-186639 A | 7/1999 |
| JP | 2000-332334 A | 11/2000 |
| JP | 2006-128382 A | 5/2006 |
| WO | 2010083948 A1 | 7/2010 |

OTHER PUBLICATIONS

The extended European search report for EP Application No. 13748512.4 dated on Sep. 15, 2015.
International Search Report for PCT Application No. PCT/JP2013/000660, mailed on Mar. 12, 2013.
Chinese Office Action for CN Application No. 201380009461.9 issued on Feb. 2, 2016 with English Translation.

* cited by examiner

*Primary Examiner* — Kevin Pyo

(57) ABSTRACT

Even when some light emitting elements among the plurality of light emitting elements fail, a repeater, can be continuously operated. Means for solving the problems A light source unit 50 which includes a plurality of pumping light source modules 51 (51*a* to 51*d*) which include light emitting elements 52 (52*a* to 52*d*) for emitting an excitation light and monitor elements 53 (53*a* to 53*d*) for monitoring the excitation lights of the light emitting elements 52 (52*a* to 52*d*), respectively, a distribution unit 40 which combines the excitation lights from the plurality of pumping light source modules 51 (51*a* to 51*d*) and distributes it, and a control unit 60 which supplies a drive current flowing serially through the plurality of light emitting elements 52 (52*a* to 52*d*) in a plurality of excitation modules 51 (51*a* to 51*d*) are included.

5 Claims, 4 Drawing Sheets

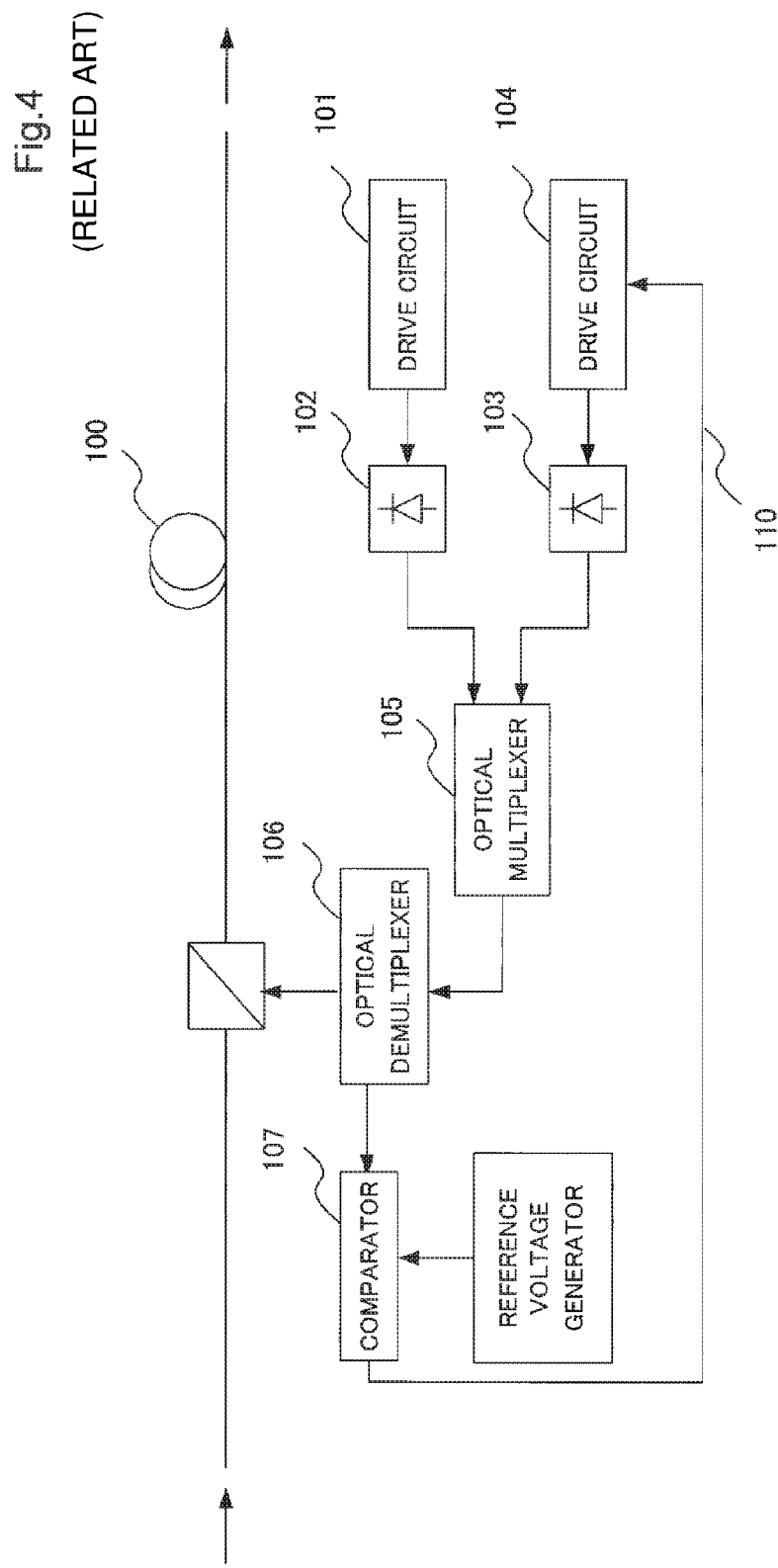

REPEATER, EXCITATION LIGHT SUPPLY DEVICE USED FOR THE SAME, AND EXCITATION LIGHT SUPPLY METHOD

This application is a National Stage Entry of PCT/JP2013/000660 filed on Feb. 7, 2013, which claims priority from Japanese Patent Application 2012-029601 filed on Feb. 14, 2012, the contents of all of which are incorporated herein by reference, in their entirety.

TECHNICAL FIELD

The present invention relates to a repeater, an excitation light supply device used for the same, and an excitation light supply method.

BACKGROUND ART

In a submarine communication system in which an optical communication path is formed undersea and communication is performed, a repeater, for amplifying an attenuated optical signal is provided. In such repeater, maintenance such as replacement, repair, or the like cannot be easily performed. Therefore, the highly reliable repeater is required. However, when the repeater is used for a long period, a failure or the like cannot be avoided. Accordingly, even when some components fail, the repeater has to be able to continue the operation.

For example, in patent document 1, a repeater shown in FIG. 4 is proposed. This repeater includes a drive circuit 101 which drives a pumping light source 102 by a constant drive current, a drive circuit 104 which drives a pumping light source 103 by the drive current according to an inputted variable control signal 110, an optical multiplexer 105 which multiplexes the excitation lights generated by the pumping light sources 102 and 103 and supplies it to a rare earth doped optical fiber 100, an optical demultiplexer 106 which demultiplexes the multiplexed light from the optical multiplexer 105, and a comparator 107 which outputs the variable control signal 110 by which a level of the demultiplexed light is kept constant based on a reference value to the drive circuit 104.

By using such structure, for example, even when the pumping light source 102 deteriorates, by variably controlling the drive current of the pumping light source 103, a problem of a shortening of a life-span of the pumping light source 102 can be coped with. Namely, when the brightness of the excitation light in the pumping light source 102 decreases, the drive circuit 104 operates to increase the brightness of the pumping light source 103 for compensating the decreased amount.

(Patent document 1) Japanese Patent Application Laid-Open No. 2006-128382

DISCLOSURE OF THE INVENTION

Problems to be Solved by the Invention

However, in the structure described in the above-mentioned patent document 1, it is assumed that the pumping light source 102 fails among two pumping light sources. This is because the pumping light source 102 is provided as an active pumping light source that operates in a normal condition and the pumping light source 103 is provided as an auxiliary light source. However, the cause of a failure cannot be known in many cases and there is no evidence to believe that the life-span of the pumping light source 103 used as the auxiliary light source is longer than that of the pumping light source 102 used as a main light source. Accordingly, there is a case in which when the brightness of the excitation light in the pumping light source 102 decreases, this degradation cannot be compensated by the excitation light of the pumping light source 103 even when the compensation is performed. In this case, a work such as repair, replacement, or the like is required to the repeater.

Accordingly, a main object of the present invention is to provide a repeater, which can be continuously used even when some light sources among a plurality of light sources fail, an excitation light supply device used for the same, and an excitation light supply method.

Means for Solving the Problems

In order to solve the above-mentioned problem, an excitation light supply device for supplying an excitation light according to the present invention is characterized by comprising a light source unit which includes a plurality of pumping light source modules, each of which includes a light emitting element for emitting the excitation light and a monitor element for monitoring the excitation light of the light emitting element, a distribution unit which combines the excitation lights from the plurality of pumping light source modules and distributes it, and a control unit which supplies a drive current flowing serially through the plurality of light emitting elements in a plurality of excitation modules.

Further, the repeater used for optical communication is characterized by comprising an optical amplifier provided to an optical fiber and an excitation light supply device which supplies the excitation light to the optical amplifier.

Further, an excitation light supply method for supplying an excitation light is characterized by including a light emission monitor step which makes a light emitting element emit the excitation light and monitors the excitation light by a monitor element at the time, a distribution step which combines the excitation lights emitted in the light emission monitor step and distributes it, a monitor signal detection step which detects a sum of the output signals of the monitor elements that are detected in the light emission monitor step as a monitor signal, and a current supply step which outputs a drive current supplied to the plurality of light emitting elements connected in series based on the monitor signal.

Effect of the Invention

By the present invention, because the plurality of light emitting elements are connected in series and the drive current is supplied, even when some light emitting elements among the plurality of light emitting elements fail, the excitation light can be continuously supplied.

BRIEF DESCRIPTION OF THE DRAWINGS

FIG. 4 is a block diagram of a repeater, applied to an explanation of a related technology.

MOST PREFERRED MODE FOR CARRYING OUT THE INVENTION

Figure 1:
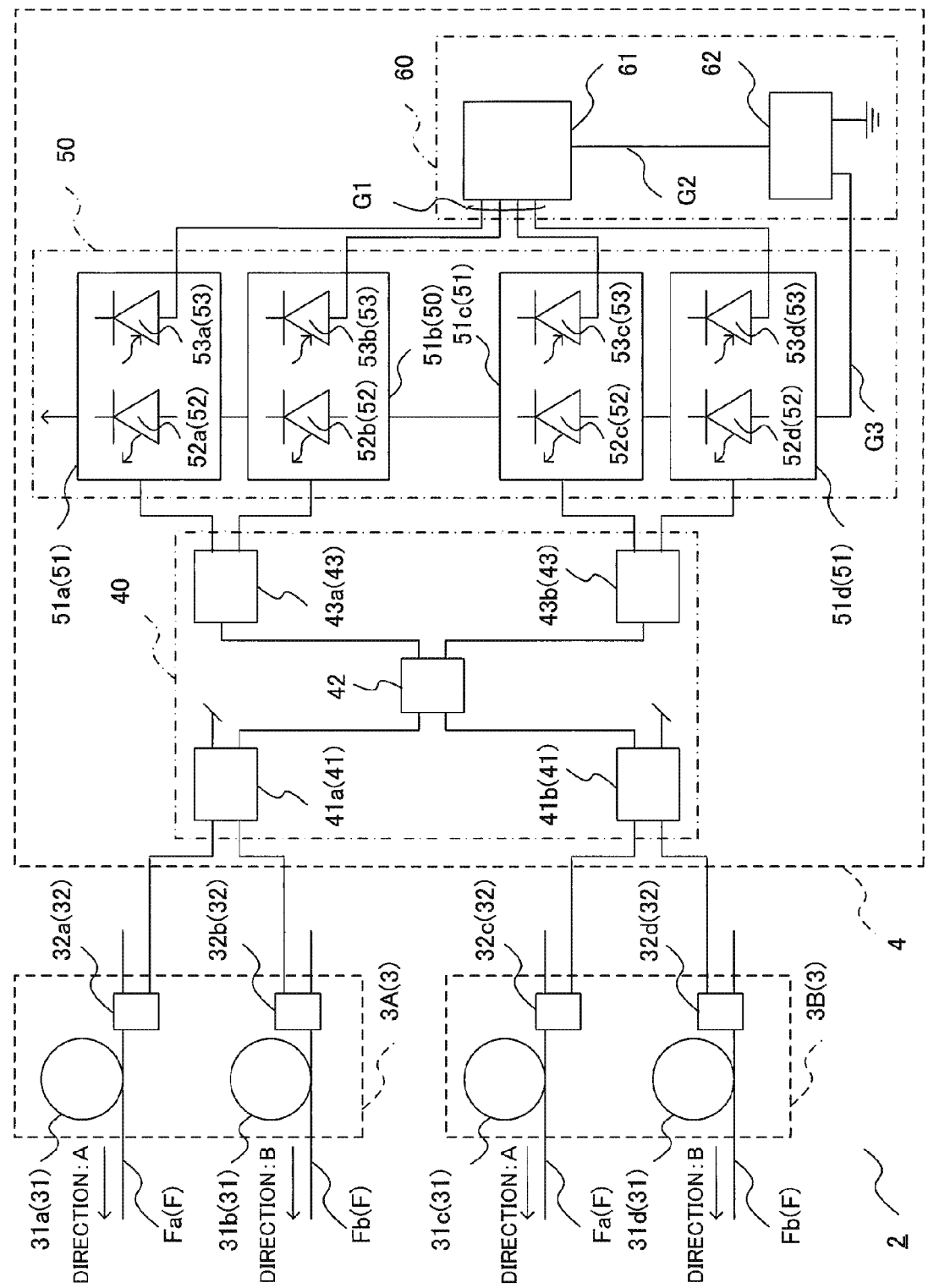
FIG. 1 is a block diagram of a repeater, according to an exemplary embodiment of the present invention.

An exemplary embodiment of the present invention will be described. FIG. 1 is a block diagram of a repeater 2 using an excitation light supply device 4 according to the present invention. The repeater 2 is composed of mainly optical amplifiers 3 (3A and 3B) and the excitation light supply device 4.

Each of the optical amplifiers 3 includes an erbium doped fibers (EDFs) 31 (31a to 31d) connected to optical fibers F (Fa and Fb) and multiplexers 32 (32a to 32d). Further, FIG. 1 shows a case in which a communication path includes two systems that are a first communication path formed by the optical fiber Fa and a second communication path formed by the optical fiber Fb and each communication path has a double-redundant configuration as an example.

The excitation light supply device 4 includes a distribution unit 40, a light source unit 50, and a control unit 60. The light source unit 50 includes pumping light source modules 51 (51a to 51d) which include excitation laser diode elements (hereinafter, referred to as light emitting element) 52 (52a to 52d) and photodiode elements for monitor (hereinafter, referred to as monitor element) 53 (53a to 53d), respectively.

In the following description, it is assumed that each pumping light source module 51 has the same specification (at least, all the pumping light source modules emit the excitation lights having the same wavelength). However, as mentioned later, the pumping light source modules 51 may have different specifications from each other (all the pumping light source modules 51 emit the excitation lights having different wavelengths from each other) according to Wavelength Division Multiplexing (WDM) transmission.

The control unit 60 includes a control circuit 61 and a drive circuit 62. The output signal of each monitor element 53 is inputted to the control circuit 61. The control circuit 61 detects a signal level of the output signal of each monitor element 53 and obtains a monitor signal G1 obtained by summing up the output signals of all the monitor elements 53. Further, for example, when the light emitting element 52b fails, because the signal level of the output signal of the monitor element 53b becomes equal to "zero", it can be judged whether or not the light emitting element fails based on this signal level. The control circuit 61 outputs a drive signal G2 so as to be made equal to a brightness value set in advance based on a result of the judgment of the signal level and the value of the monitor signal G1.

The drive circuit 62 sets a drive current G3 based on the drive signal G2 and outputs it. This drive current G3 flows serially through all the light emitting elements 52. Accordingly, when all the light emitting devices 52 have the same specification, all the light emitting devices 52 emit the excitation lights having the same wavelength and the same brightness. Of course, even when all the light emitting devices 52 have the same specification, the individual difference exists among all the light emitting devices 52 or the like. Accordingly, even when all the light emitting devices 52 are driven by the same drive current G3, there is a case in which the wavelengths and the brightnesses of all the excitation lights are not completely equal to each other. However, when at least a difference between the wavelengths is within an allowable error range and it can be considered that the wavelengths are substantially equal to each other, it is not necessary to meet a condition in which the brightnesses are equal to each other. This reason will be described in an explanation of the distribution unit 40.

The distribution unit 40 includes distributors 41 (41a and 41b), a combining distributor 42, and combiners 43 (43a and 43b). The excitation lights from the pumping light source modules 51a and 51b are inputted to the combiner 43a, these excitation lights are combined, and the combined light is outputted to the combining distributor 42. Further, the excitation lights from the pumping light source modules 51c and 51d are inputted to the combiner 43b, these excitation lights are combined, and the combined light is outputted to the combining distributor 42. Accordingly, the excitation lights from the combiners 43a and 43b are inputted to the combining distributor 42. Namely, the excitation lights emitted by the pumping light source modules 51a to 51d are collected to the combining distributor 42 and distributed to the distributor 41.

Because the drive current G3 from the drive circuit 62 is supplied to the light emitting elements 52 that are connected in series, it is expected that the wavelengths and the brightnesses of the excitation lights emitted by all the light emitting devices 52 are the same in principle. However, as described above, there is dispersion due to the individual difference or the like. Therefore, even in this case, when a difference between the wavelengths is within an allowable error range and it can be considered that the wavelengths are substantially equal to each other, the dispersion of brightness is not considered. The reason is because the excitation lights emitted by all the light emitting elements are collected to the combining distributor 42, the collected excitation lights are redistributed, and whereby, the brightness dispersion due to the individual difference is removed.

Figure 2:
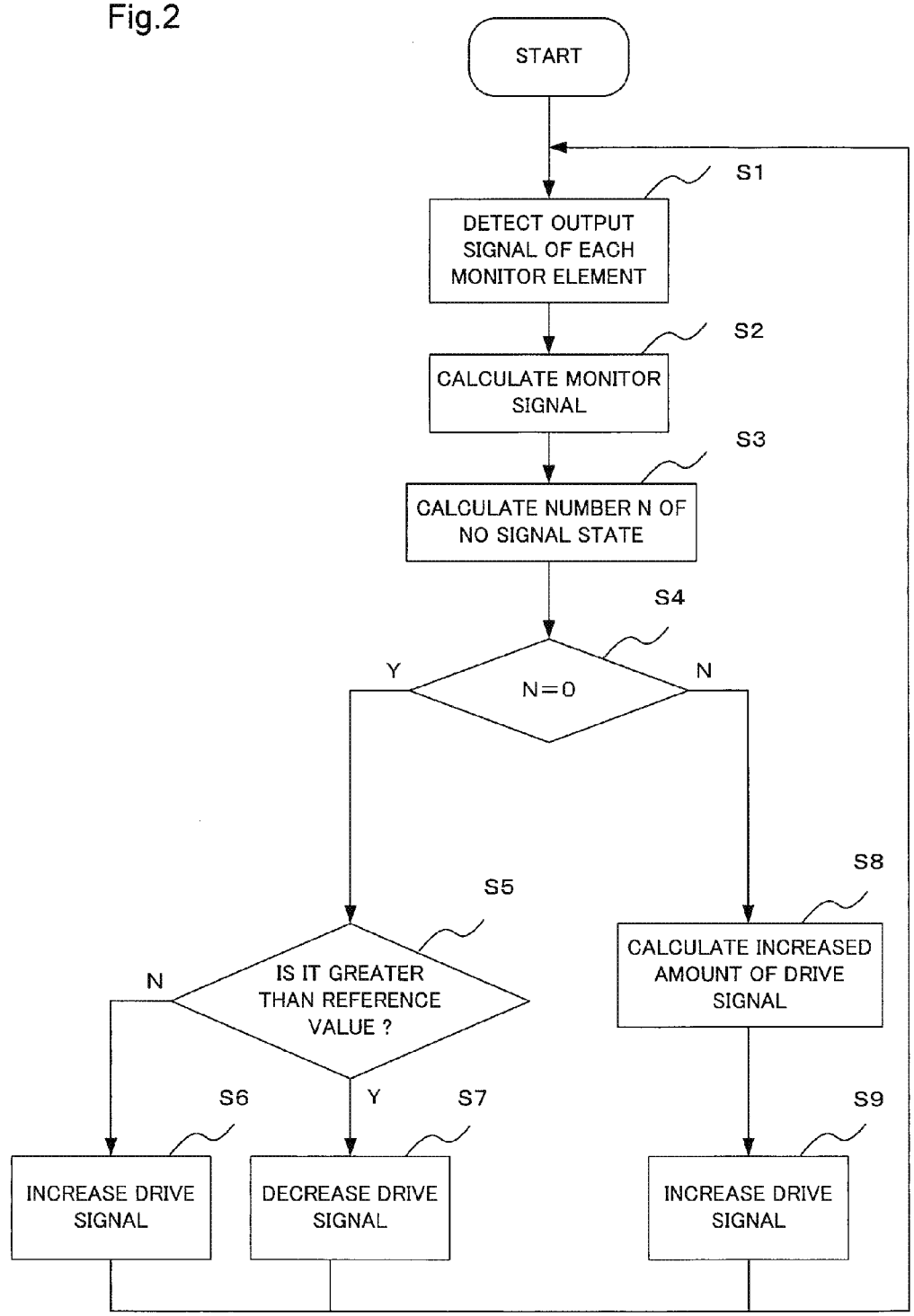
FIG. 2 is a flowchart showing a control procedure of a control unit in a repeater.

An operation of the control circuit 61 will be described with reference to a flowchart shown in FIG. 2.

Steps S1 and S2: The control circuit 61 detects the output signals of all the monitor elements 53, sums up the output signals, and uses the sum as the monitor signal G1.

Steps S3 and S4: The control circuit 61 monitors whether or not a no signal state (in which a signal level is zero) exists in the detected output signal of each monitor element 53 and counts the number N of the output signals in which the no signal state exists. The no-signal state of the output signal means that the light is not emitted because the light emitting element 52 corresponding to the monitor element 53 fails. When the number N of no-signal states is equal to zero, a process proceeds to Step S5 and when the number N of no-signal states is equal to or greater than one, a process proceeds to Step S8.

Step S5: Because the output signal in the no-signal state (N=0) does not exist, the control circuit 61 judges whether or not the monitor signal G1 is greater than a reference value.

Steps S6 and S7: When the monitor signal G1 is greater than the reference value, the level of the drive signal G2 is reduced and when the monitor signal G1 is less than the reference value, the level of the drive signal G2 is increased. Further, because the monitor signal G1 is the sum of the output signals of all the light emitting elements 52, the brightness value in the combining distributor 42 corresponds to the level value of the monitor signal G1. Accordingly, even when the individual difference exists among the light emitting devices 52, the control circuit 61 can keep the brightness value in the combining distributor 42 constant at all times by generating the drive signal G2 by which a level of the monitor signal G1 is made equal to a reference value.

Steps S8 and S9: On the other hand, in Step S4, when the number N of no-signal states is greater than or equal to one, an increased/decreased amount of the drive signal G2 is set according to the detected number N of no-signal states. Generally, when the light emitting element 52 fails, the light emitting element 52 is short-circuited. In such case, the brightness value of the excitation lights collected to the combining distributor 42 cannot be made equal to a target brightness value without the great increase of the drive current G3. Accordingly, the control circuit 61 sets the increased/decreased amount of the drive signal G2 according to the number N of no-signal states.

For example, it will be considered a case in which when all the light emitting elements 52 emit the excitation lights having the same wavelength (when an optical signal having a single wavelength is used), the output signal of the monitor element 53b is in the no-signal state. In this case, the control circuit 61 determines that the light emitting element 52b is short-circuited and increases the drive current G3 by 5/4 times. Further, for example, it will be considered a case in which when the light emitting elements 52a and 52c and the light emitting elements 52b and 52d emit the excitation lights having the same wavelength (in a case of WDM transmission in which a wavelength multiplexed optical signal is transmitted), the output signal of the monitor element 53b is in the no-signal state. In this case, the control circuit 61 determines that the light emitting element 52b is short-circuited and increases the drive current G3 by 3/2 times. Thus, the drive current is controlled according to whether or not the light emitting element fails and whereby, the brightness values of the excitation lights collected to the combining distributor 42 can be kept constant.

The output of the distributor 41 is distributed to the multiplexers 32 (32a to 32d). The multiplexers 32a and 32c are provided to the optical fiber Fa of the first communication path having a redundant configuration and the multiplexers 32b and 32d are provided to the optical fiber Fb of the second communication path having a redundant configuration. By this configuration, the excitation lights having the wavelengths of the lights emitted by the light emitting elements 52 are supplied to each optical fiber F via the multiplexer 32.

On the other hand, the optical signal is transmitted through the optical fiber F via an erbium doped fiber (EDF) 31. As is well known, the EDF 31 has a function to amplify an incident light and output it. The energy required at that time is obtained from the excitation light supplied from the multiplexer 32. As a result, the optical signal transmitted through the optical fiber F is amplified by the EDF 31.

Further, in the explanation described above, because the optical signal having a single wavelength is used, it is assumed that all the light emitting elements 52 are the excitation laser diode elements having the same specification. However, this exemplary embodiment is not limited to these conditions. Namely, even when the communication system using WDM transmission is used, this exemplary embodiment can be applied to the communication system. When the communication system using WDM transmission is used, the optical signals having different wavelengths from each other are used.

For example, it is assumed that the optical signal having two wavelengths of 974 nm and 976 nm is used, the light emitting device 52a and the light emitting device 52c emit the excitation lights having the same wavelength, and the light emitting element 52b and the light emitting element 52d emit the excitation lights having the same wavelength. In this case, the excitation lights emitted by the light emitting elements 52a and 52c and the excitation lights emitted by the light emitting elements 52b and 52d are combined by the combining distributor 42 via the combiner 43 and the combined light is distributed. Therefore, the excitation light having two wavelengths is inputted to the multiplexer 32. Accordingly, even when the optical signal having two wavelengths is used, the optical amplification can be achieved. Of course, in this example, the optical signal having two wavelengths is used. When the optical signal having many wavelengths is used, the excitation laser diode elements having different specifications from each other are used according to the number of the used wavelengths.

Figure 3:
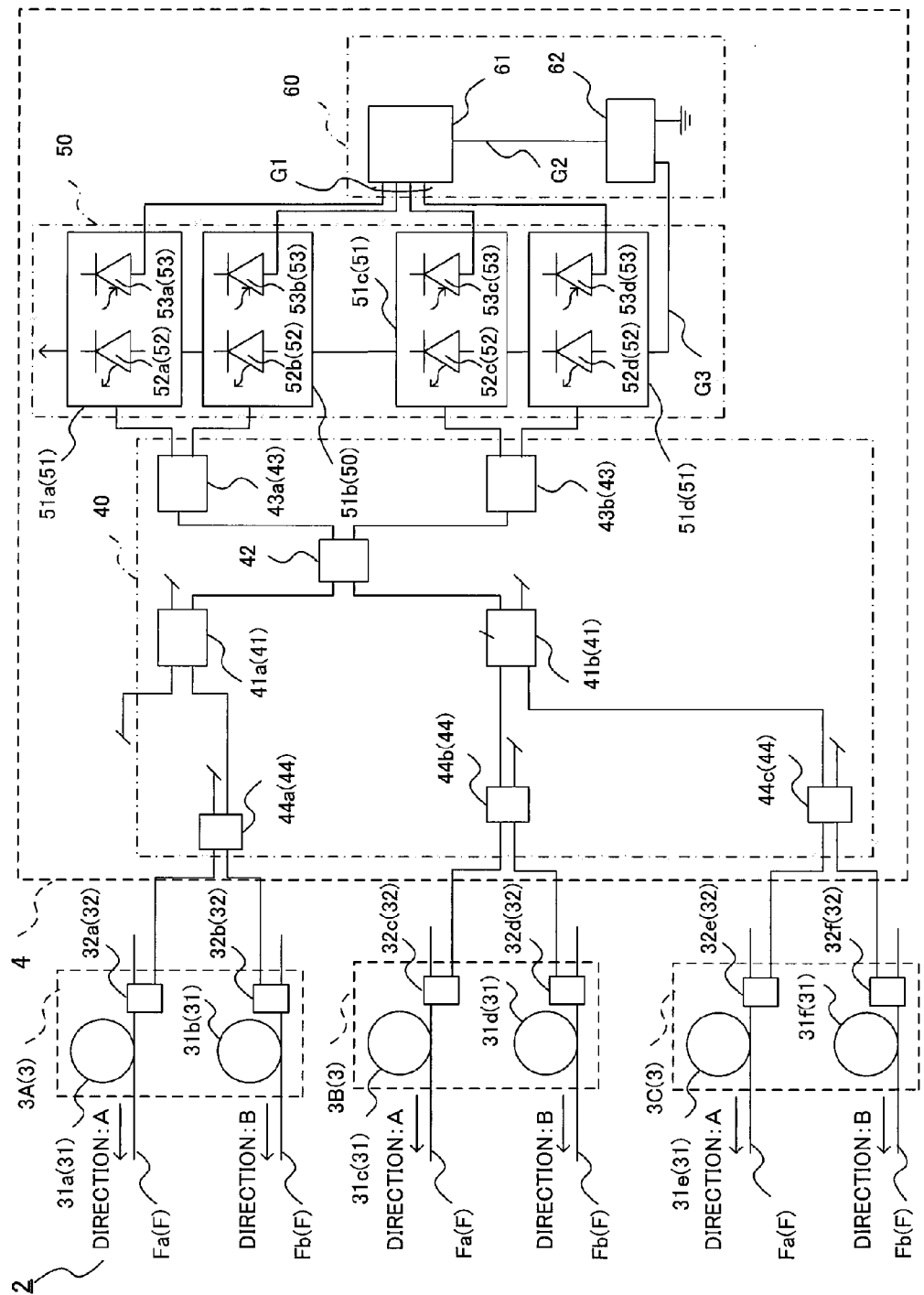
FIG. 3 is a block diagram of a repeater, having another configuration.

Further, in the above-mentioned explanation of the repeater, the communication path having a double redundant configuration is used. However, in the present invention, the number of redundancies is not limited to the above-mentioned number. For example, as shown in FIG. 3, the communication path having a triple redundant configuration can be used. In FIG. 3, distributors 44 (44a to 44c) by which a signal is equally split into two output signals are added according to the number of redundancies.

As described above, all the light emitting devices are connected in series and the drive current flowing serially through all the plurality of light emitting elements is supplied. Therefore, the repeater can be used until all the light emitting devices fail. In particular, because the current for driving the plurality of light emitting devices can be supplied by using one control circuit and one drive circuit, the control unit with a simple configuration can be used. Therefore, the cost of the control unit can be reduced and the failure occurrence frequency thereof can be reduced. Further, the plurality of light emitting devices have no specific role such as a main light source or an auxiliary light source and can operate as the main light source or the auxiliary light source. Therefore, the light emitting device has an advantage in which the light emitting device can have a large operation margin because all the light emitting devices have the same role. Accordingly, the reliability of the repeater is improved and whereby, a cost for maintenance or the like can be reduced.

This application claims priority from Japanese Patent Application No. 2012-029601, filed on Feb. 14, 2012, the disclosure of which is hereby incorporated by reference in its entirety.

DESCRIPTION OF SYMBOL

2 repeater
4 excitation light supply device
32 (32a to 32d) multiplexer
3 (3A and 3B) optical amplifier
40 distribution unit
41 distributor
42 combining distributor
43 (43a and 43b) combiner
50 light source unit
51 (51a to 51d) pumping light source module
52 (52a to 52d) light emitting element
53 (53a to 53d) monitor element
60 control unit
61 control circuit
62 drive circuit

What is claimed is:

1. An excitation light supply device which supplies an excitation light, comprising:
   a light source unit which includes a plurality of excitation light source modules, each of which includes a light emitting element for emitting the excitation light and a monitor element for monitoring the excitation light of the light emitting element;
   a distribution unit which combines the excitation lights from the plurality of excitation light source modules and distributes the combined excitation lights; and a control unit which supplies a drive current flowing serially through the plurality of light emitting elements in the plurality of excitation light source modules, wherein the control unit comprises:

a control circuit which monitors whether or not a no signal state in which a level of the output signal from the monitor element is zero exists, detects an output signal of the monitor element, obtains a sum of the output signals as a monitor signal, generates a drive signal by which a level of the monitor signal is made equal to a reference value set in advance and outputs the drive signal when the no signal state does not exist; and a drive circuit which outputs the drive current to the light source unit based on the drive signal, and wherein the control circuit generates the drive signal based on a number of no signal states when the no signal state exists.

2. The excitation light supply device according to claim 1, wherein one excitation light source module emits the excitation light having a predetermined wavelength and the wavelengths of the excitation lights emitted by the plurality of excitation light source modules are set so that the excitation lights having a plurality of wavelengths are supplied to the distribution unit.

3. A repeater, used for optical communication, comprising:

an optical amplifier provided to an optical fiber; and an excitation light supply device described in claim 1 which supplies an excitation light to the optical amplifier.

4. An excitation light supply method for supplying an excitation light, comprising the steps of:

emitting the excitation light from a light emitting element and monitoring the excitation light by a monitor element at the time;

combining the emitted excitation lights and distributing it by a distribution unit;

detecting a sum of the detected output signals of the monitor elements as a monitor signal;

outputting a drive current supplied to the plurality of light emitting elements connected in series based on the monitor signal; and monitoring whether or not a no signal state in which a level of the detected output signal of the monitor element is zero exists, wherein the drive current is outputted based on the number of no signal states and the monitor signal.

5. The excitation light supply method according to claim 4, wherein the light emitting elements emit the excitation lights having different wavelengths from each other.

* * * * *